US011398692B2

(12) United States Patent
Hardikar et al.

(10) Patent No.: US 11,398,692 B2
(45) Date of Patent: Jul. 26, 2022

(54) SOCKET WITH INTEGRATED FLEX CONNECTOR

(71) Applicant: Apple Inc., Cupertino, CA (US)

(72) Inventors: Mahesh S. Hardikar, San Jose, CA (US); David A. Secker, San Jose, CA (US); Rajasekaran Swaminathan, Austin, TX (US); Ravindranath T. Kollipara, Palo Alto, CA (US); Robert R. Atkinson, Chandler, AZ (US)

(73) Assignee: Apple Inc., Cupertino, CA (US)

( * ) Notice: Subject to any disclaimer, the term of this patent is extended or adjusted under 35 U.S.C. 154(b) by 27 days.

(21) Appl. No.: 17/032,488

(22) Filed: Sep. 25, 2020

(65) Prior Publication Data

US 2022/0102884 A1 Mar. 31, 2022

(51) Int. Cl.
*H05K 1/02* (2006.01)
*H01R 12/71* (2011.01)
*H01R 13/24* (2006.01)

(52) U.S. Cl.
CPC .......... *H01R 12/716* (2013.01); *H01R 13/24* (2013.01)

(58) Field of Classification Search
CPC .............................. H01R 12/716; H01R 13/24
See application file for complete search history.

(56) References Cited

U.S. PATENT DOCUMENTS

| | | | |
|---|---|---|---|
| 5,008,656 A * | 4/1991 | Cheriff ................... | H05K 1/112 345/206 |
| 6,532,152 B1 * | 3/2003 | White ............... | G02F 1/133308 361/692 |
| 7,148,428 B2 | 12/2006 | Meier et al. | |
| 9,490,560 B2 | 11/2016 | Chawla et al. | |
| 9,590,338 B1 | 3/2017 | Schmitt et al. | |
| 10,354,939 B2 * | 7/2019 | Yosui .................. | H01L 23/3677 |
| 10,438,884 B2 * | 10/2019 | Lee ......................... | H01L 23/15 |
| 10,490,478 B2 * | 11/2019 | Lin ........................ | H01L 23/367 |
| 10,832,980 B2 * | 11/2020 | Kisaki ..................... | H05K 1/113 |
| 10,856,432 B1 * | 12/2020 | Blackburn ............ | H01R 13/64 |
| 11,121,511 B1 * | 9/2021 | Long .................. | H01R 13/6584 |
| 2003/0214800 A1 * | 11/2003 | Dibene, II ............. | G06F 1/182 361/803 |
| 2011/0294308 A1 | 12/2011 | Kuwata et al. | |
| 2012/0105087 A1 * | 5/2012 | Mackenzie ........ | G01R 31/2808 324/750.03 |

(Continued)

*Primary Examiner* — Abdullah A Riyami
*Assistant Examiner* — Nelson R. Burgos-Guntin
(74) *Attorney, Agent, or Firm* — Aikin & Gallant, LLP

(57) ABSTRACT

The connector portion of a flex connector may be integrated into a socket, by forming a complete cutout in the socket in which the connector is located, or by forming the socket with a portion having a reduced thickness relative to the rest of the socket, with the connector being positioned in this portion of reduced thickness between the socket and an MLB. Another flex connector may be formed vertically above the first flex connector, mounted to the top surface of the package and clamped in place by a heat sink on top of the stack. Providing both top and bottom flex connectors may multiply the number of available connections for a given footprint. A heatsink positioned on top of the stack may include a spring assembly on a bottom portion to engage specified portions of the stack with a predefined force to ensure correct loading.

16 Claims, 12 Drawing Sheets

(56) References Cited

U.S. PATENT DOCUMENTS

| | | | |
|---|---|---|---|
| 2013/0004120 A1* | 1/2013 | Zbinden | H04B 10/25891 385/14 |
| 2017/0018497 A1* | 1/2017 | Zhai | H01L 24/17 |
| 2018/0019178 A1* | 1/2018 | Lin | H01L 23/13 |
| 2018/0084680 A1* | 3/2018 | Jarvis | H01M 50/20 |
| 2019/0097339 A1* | 3/2019 | Lim | H01R 12/78 |
| 2019/0150311 A1* | 5/2019 | Mason | H01R 12/82 439/55 |
| 2020/0107463 A1* | 4/2020 | Nekkanty | H05K 1/141 |
| 2020/0267845 A1* | 8/2020 | Wan Azha | H01L 25/072 |
| 2021/0193557 A1* | 6/2021 | Yao | H01R 13/639 |

* cited by examiner

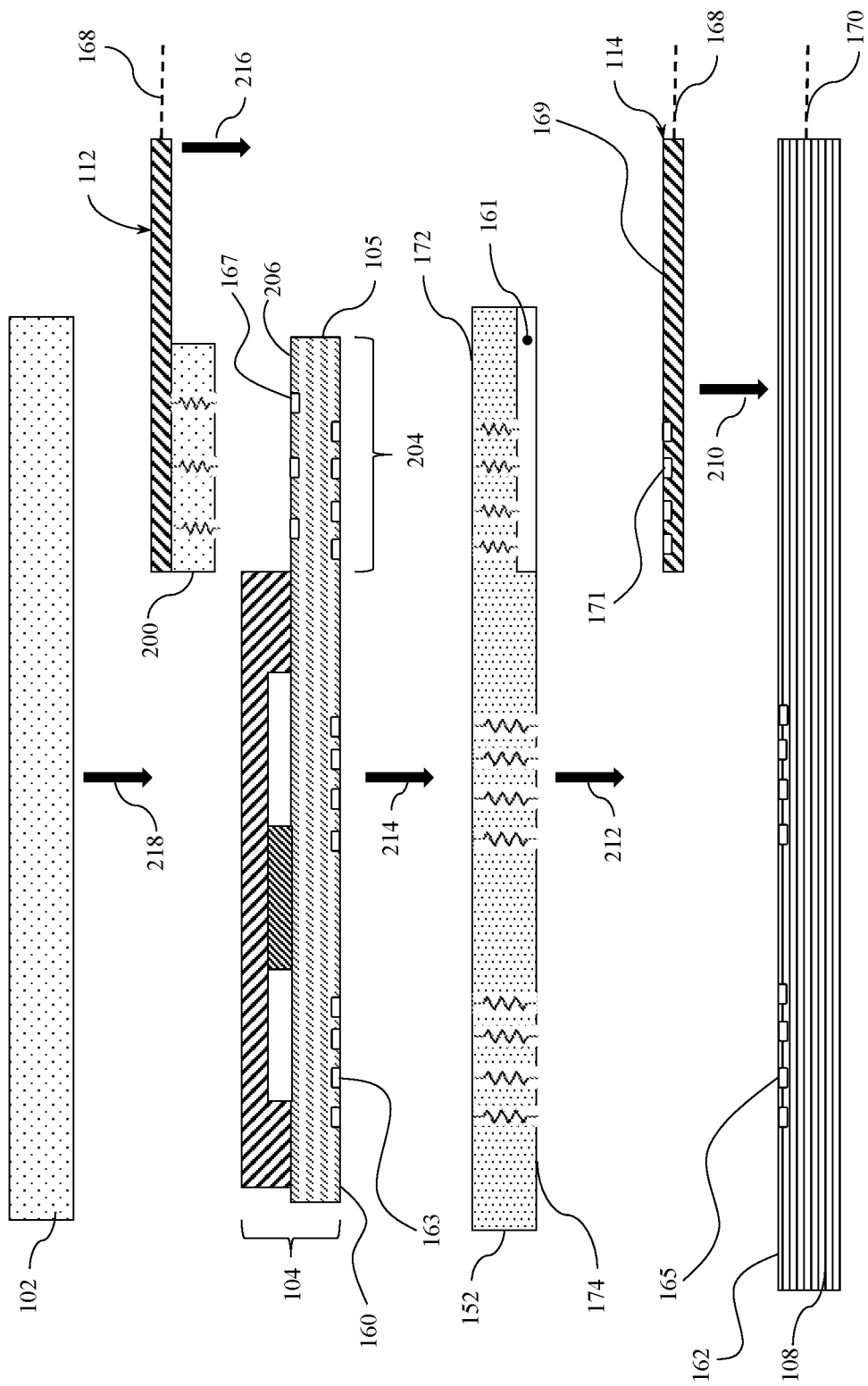

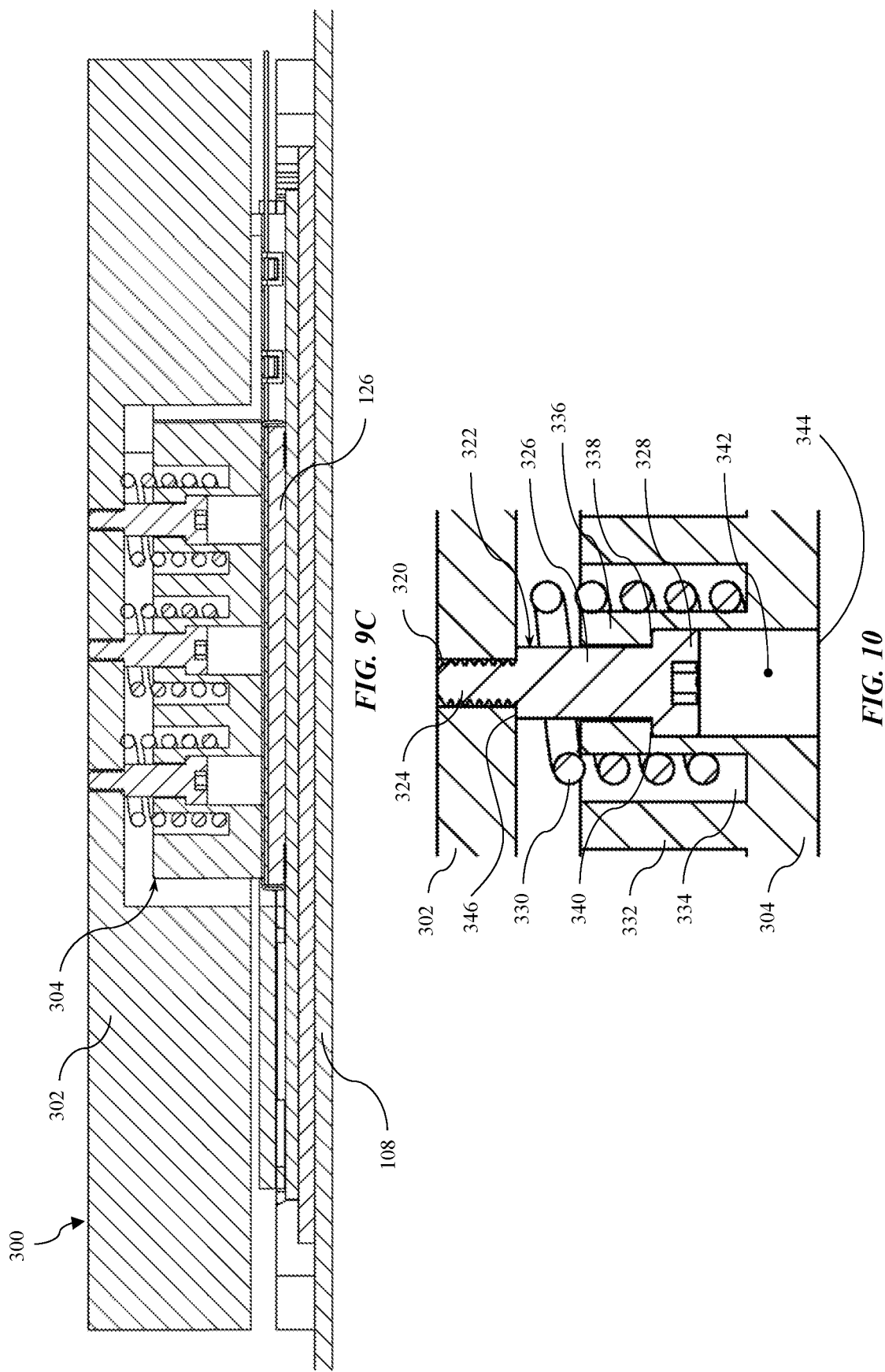

SOCKET WITH INTEGRATED FLEX CONNECTOR

BACKGROUND

Field

Embodiments described herein relate to electronic packaging. More particularly, embodiments relate to sockets, flexible connectors, and heat sinks.

Background Information

When mounting a processor package to a printer circuit board ("PCB") or multi-layer board ("MLB"), flexible connectors (commonly referred to as "flex connectors") are often used to connect the processor package with other board components. The flex connectors extend laterally from the processor package, restricting the number of connections that can be made for any particular footprint. Also, when mounting a processor package to an MLB via a processor socket, typically a pair of screws are used, which can unevenly distribute the clamping forces.

SUMMARY

Embodiment are described of electronic packages and packaging processes including sockets including one or more integrated flex connector. In an embodiment, an electronic structure includes a multi-layer board (MLB) having a top surface, a flex connector including a set of electrical connectors, with the flex connector being positioned on said MLB top surface with said set of electrical connectors oriented away from said MLB, a socket having a top surface and a bottom surface, the socket including a plurality of electrical connectors extending therethrough between said top and bottom surfaces, wherein the socket includes a first portion with a first thickness between said top and bottom surfaces, and a second portion with a second thickness between said top and bottom surfaces, wherein said first thickness is greater than said second thickness, and wherein the socket is positioned with said first portion in contact with the MLB, and a portion of the flex connector including the set of electrical connectors positioned between said second portion and said MLB.

In some embodiments, the second thickness is zero thereby forming a void in the second portion, and the flex connector extends through the void. A package may be positioned on the socket on a side of the socket opposite the MLB, with the package directly contacting the said flex connector. The flex connector may be a first flex connector, and a second flex connector may be provided, positioned vertically above the first flex connector and mounted to and in electrical communication with a surface of the package opposite the socket.

In some embodiments, the package includes a ledge portion including the surface of the package opposite the socket at which the package is in electrical communication with the second flex connector. The package may have an overall vertical thickness and include a package substrate having a vertical thickness less than the package overall vertical thickness, and a combined vertical thickness of the second flex connector and of the package substrate may be the same as the overall vertical thickness of the package.

In embodiments, the package is a first package and the set of flex electrical connectors is a first set of electrical connectors located at a first end of the flex connector, and further including a second package, and a second set of electrical connectors located at a second end of the flex connector, wherein the second set of flex electrical connectors is connected to the second package.

In embodiments, the set of flex electrical connectors is vertically aligned with at least some of the plurality of socket electrical connectors.

A package may be positioned on and in electrical communication with the socket on a side of the socket opposite the MLB, with the package directly contacting the socket in the second portion, and the socket directly contacting the flex connector in the second portion. A vertical thickness of the socket in the first portion may be the same as the combined vertical thicknesses of the socket and the flex connector in the second portion.

A heat sink may be positioned on a side of the socket opposite the MLB. The heat sink may include a heat conducting body including at least one cavity, and at least one load controlling insert positioned in said at least one cavity and attached to said body, wherein the load controlling insert may be configured and arranged to variably control load transmitted through said insert from said body. The at least one load controlling insert may include at least one force control assembly.

An at least one force control assembly may include a variable force generating member, and walls defining a cavity, and the variable force generating member may be captured in the cavity between the walls and the heat conducting body. In embodiments, the variable force generating member may include a coil spring, a disc spring, a wave spring, or a polymer sleeve spring. The at least one force control assembly may include a fastener connecting the at least one force control assembly to the heat conducting body.

The fastener may include a screw having a screw thread, and the heat conducting body may include a bore having a matching screw thread, in which force transmitted by the at least one force control assembly is adjustable by adjusting the screw relative to the bore in the body.

BRIEF DESCRIPTION OF THE DRAWINGS

Inventions of the present disclosure will now be described in more detail with reference to exemplary embodiments of apparatus and methods, given only by way of example, and with reference to the accompanying drawings, in which:

FIG. 7A illustrates another exemplary embodiment of a process of assembling electronic components;

FIG. 9C illustrates a cross-sectional view similar to FIG. 3B, with a heat sink of FIG. 9A positioned at the top of a stack of components; and FIG. 10 illustrates a highly enlarged cross-sectional view of a portion of FIG. 9C.

DETAILED DESCRIPTION

Figure 1:
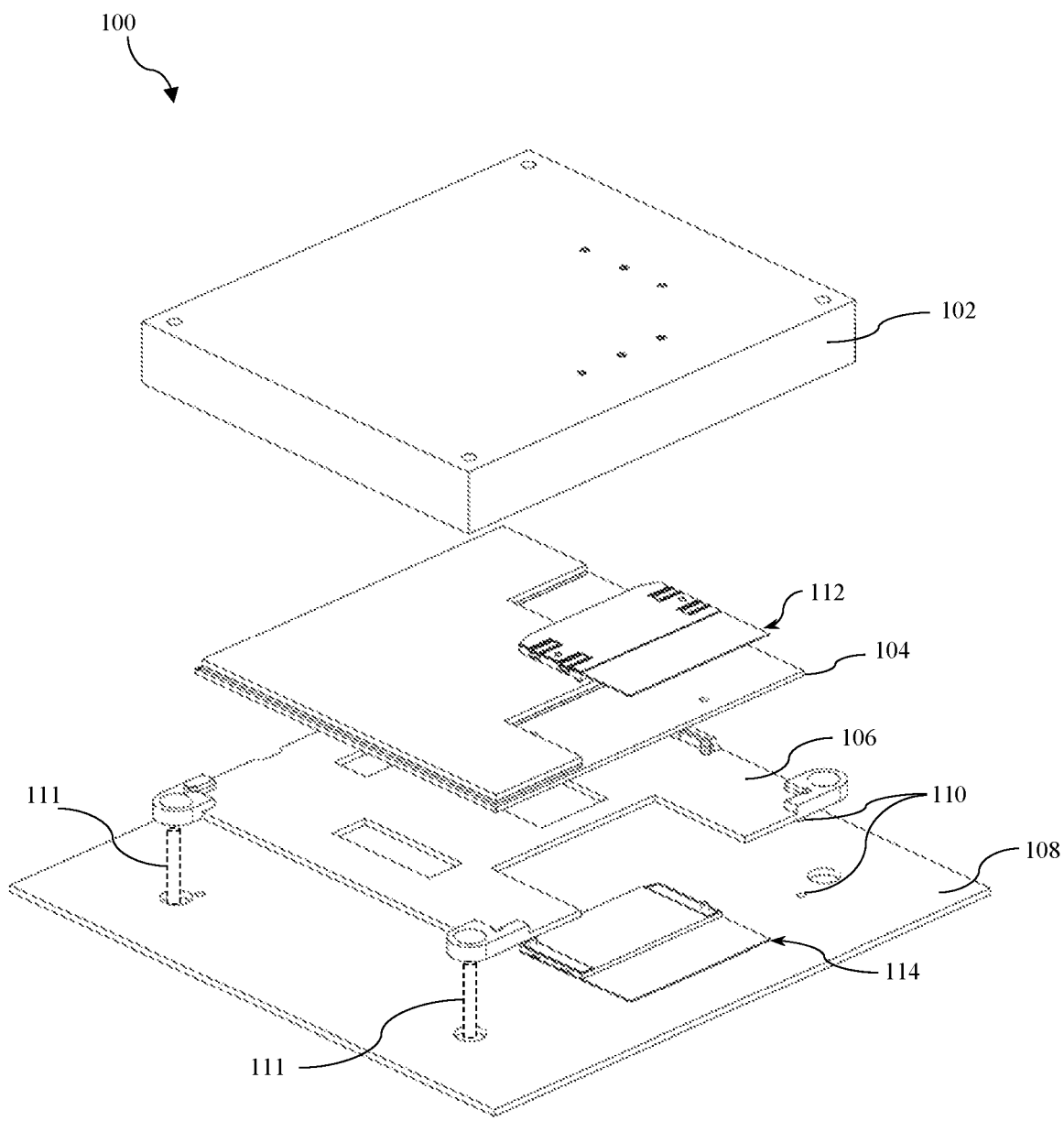
FIG. 1 illustrates an exploded perspective view of an embodiment of electronic components to be mounted to an MLB.

Referring to the drawing figures, like reference numerals designate identical or corresponding elements throughout the several figures.

The singular forms "a," "an," and "the" include plural referents unless the context clearly dictates otherwise. Thus, for example, reference to "a processor" includes reference to one or more of such processors.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the embodiments. In other instances, well-known packaging techniques have not been described in particular detail in order to not unnecessarily obscure the embodiments. Reference throughout this specification to "one embodiment" means that a particular feature, structure, configuration, or characteristic described in connection with the embodiment is included in at least one embodiment. Thus, the appearances of the phrase "in one embodiment" in various places throughout this specification are not necessarily referring to the same embodiment. Furthermore, the particular features, structures, configurations, or characteristics may be combined in any suitable manner in one or more embodiments.

The terms "over", "to", "between", and "on" as used herein may refer to a relative position of one layer with respect to other layers. One layer "over", or "on" another layer in "contact" with another layer may be directly in contact with the other layer or may have one or more intervening layers. One layer "between" layers may be directly in contact with the layers or may have one or more intervening layers.

In one aspect, embodiments described herein may include a flex connector integrated into a socket. For example, the socket may be a package socket for connecting a package such as a processor package to an MLB, such as a PCB. Such integration may allow for high speed signals to escape from the package substrate through the socket into the flex connector, which may enable lower power and/or signal loss, instead of through the MLB. A hybrid socket as described herein, which may include two different contacts in one housing, may eliminate the need for a separate specific flex connector to interface with the package substrate. Such a hybrid socket may also allow for better package substrate-to-socket contact registration, at least because a first socket portion to provide electrical communication between the package substrate and MLB, and a second socket portion to provide electrical connection between the package substrate and flex connector, may be formed as a single component, e.g., an injection molded component.

In another aspect, embodiments described herein may include a topside flex connector, in which a flex connector may be integrated on a top side of a package substrate, which may allow for a higher density (e.g., IO count) product in the same footprint as prior devices not including a topside flex connector. High speed signals escaping through a topside flex connector on a top routing layer in a package substrate may have much lower loss, as they may not encounter core/plated-through hole (PTH) vias in the package substrate or MLB and may be routed in a lower loss flex connector instead of a MLB with more loss. For a given IO count, deploying both the topside and the bottom side flex connectors may result in significantly shorter signal trace lengths on the package for both the top and bottom routed flex connectors. These shorter trace lengths may further reduce the trace losses as the package, as trace loss per unit length is greater than that of the flex or MLB.

In yet another aspect, embodiments described herein may include a compression mechanism for a microprocessor stack. As a socketed product may require a heatsink and compression to establish contact between a package, a socket, and an MLB, the same heatsink may include helical spring loaded pedestals which can align with the a topside flex connector and provide requisite loading to maintain the connector in contact with the package.

FIG. 1 illustrates a first exemplary embodiment of an electronic structure 100 implementing a socket having an integrated flex connector. FIG. 1 illustrates a heat sink 102, which may overlay a package 104. The package 104 may in turn overlay and be in electrical communication with a socket 106. The socket 106 may in turn overlay and be in electrical communication with a multi-layer board (MLB) 108, which may be a PCB. Each of the heat sink 102, package 104, socket 106, and/or MLB 108 may include alignment features 110, which may be any known alignment features such as pegs and holes, which align adjacent components to predetermined orientations so that the combination of components can function. Fasteners 111 may also be provided to extend from below MLB 108, through one or more of the socket and package, and into and/or through the heat sink 102. Fasteners 111, which may be screws, rivets, or the like, function to compress the components between the heat sink 102 and the MLB 108, via nuts or the like (not illustrated) on ends of the fasteners.

FIG. 1 also illustrates an upper flex connector 112 positioned to make electrical connections with top portions of package 104, and a lower flex connector 114 positioned to make electrical connections with lower portions of package 104 through a cutout in socket 106.

Figure 2:
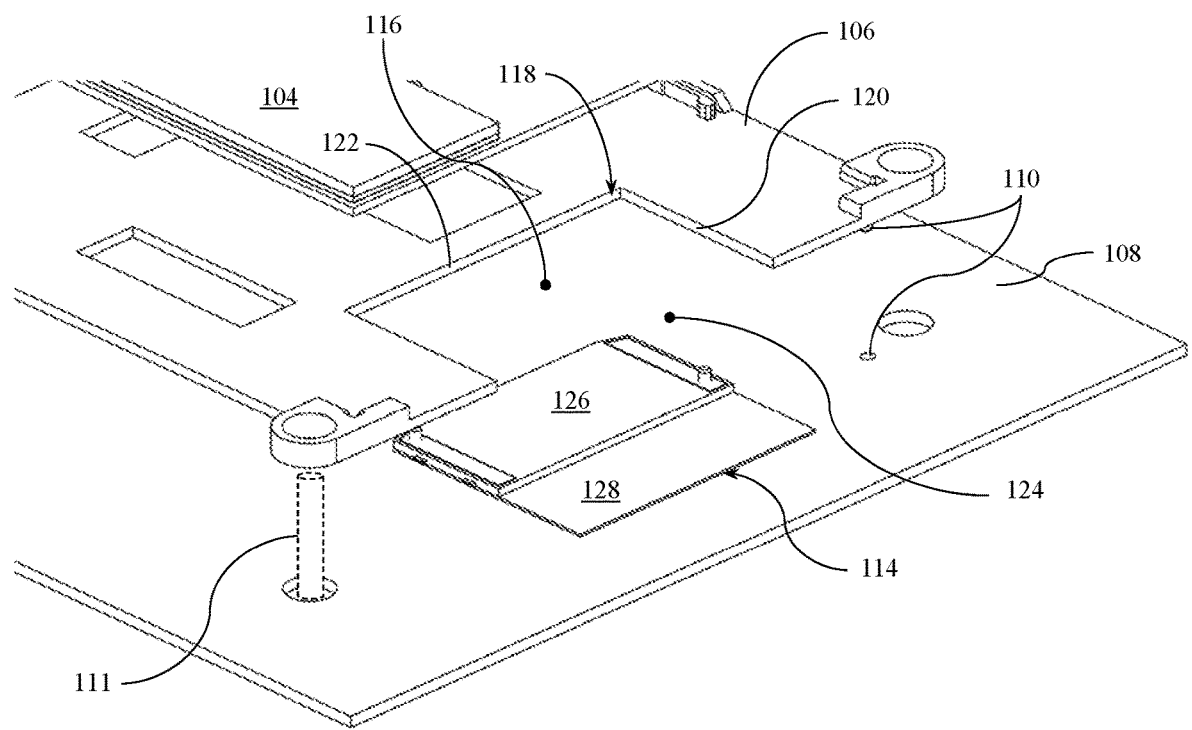
FIG. 2 illustrates an enlarged view of the embodiment of FIG. 1.

FIG. 2 illustrates an enlarged view of portions of FIG. 1. Socket 106 includes a void or cutout 116 formed by sidewalls 118, which may include a first sidewall 122 and intersecting sidewalls 120. Cutout 116 may have a side opening 124, or may include another first sidewall 122 which also intersects with sidewalls 120 to form a closed hole (not illustrated). Flex connector 114 may include a connector portion 126 which may include a set of electrical connectors 171 (see, e.g., FIGS. 6A, 7A) oriented away from the MLB 108, and a conducting flexible portion 128, which may include one or more electrical routing layers to conduct electrical signals from the connector portion 126 and through the flexible portion 128. It is to be appreciated that while the flexible portion 128 is shown as terminating, this section can extend from a first connector portion 126 at one end to a second connector portion 126 at a second end to connect between two sockets 106 and packages 104. Similarly, the upper flex connector 112 can also include a flexible portion between two connector portions to connect between two sockets and packages.

Cutout 116 is sized and configured so that at least connector portion 126 of flex connector 114 extends vertically through the cutout of the socket 106 and makes electrical contact with overlying portions of package 104, when the package, socket, flex connector, and MLB 108 are pressed together. FIG. 2 also illustrates fasteners 111 and alignment features 110. The flex connector 114 may be attached to the MLB 108 before the flex connector is connected to the package 104, or the flex connector 114 may be attached to the MLB after the flex connector is connected to the package. The flex connector 114 may be held in place on the MLB 108 by a low strength mechanism, which may include magnets, low strength adhesive, or the like, between the flex connector and the MLB, which may facilitate the assembly process. Locator features (not illustrated) between flex connector 114 and MLB 108 may be provided, and may include clearance fit pegs and holes, in addition to the low strength mechanism. Flex connector 114 may also include a precise alignment feature with an overlying package substrate portion of the package 104, which may be molded into the connector (e.g. a peg), and a vertically aligned through hole may be formed in the package substrate that can hold the flex connector in place until compression hardware is installed, such as that described in greater detail elsewhere herein.

Figure 3:
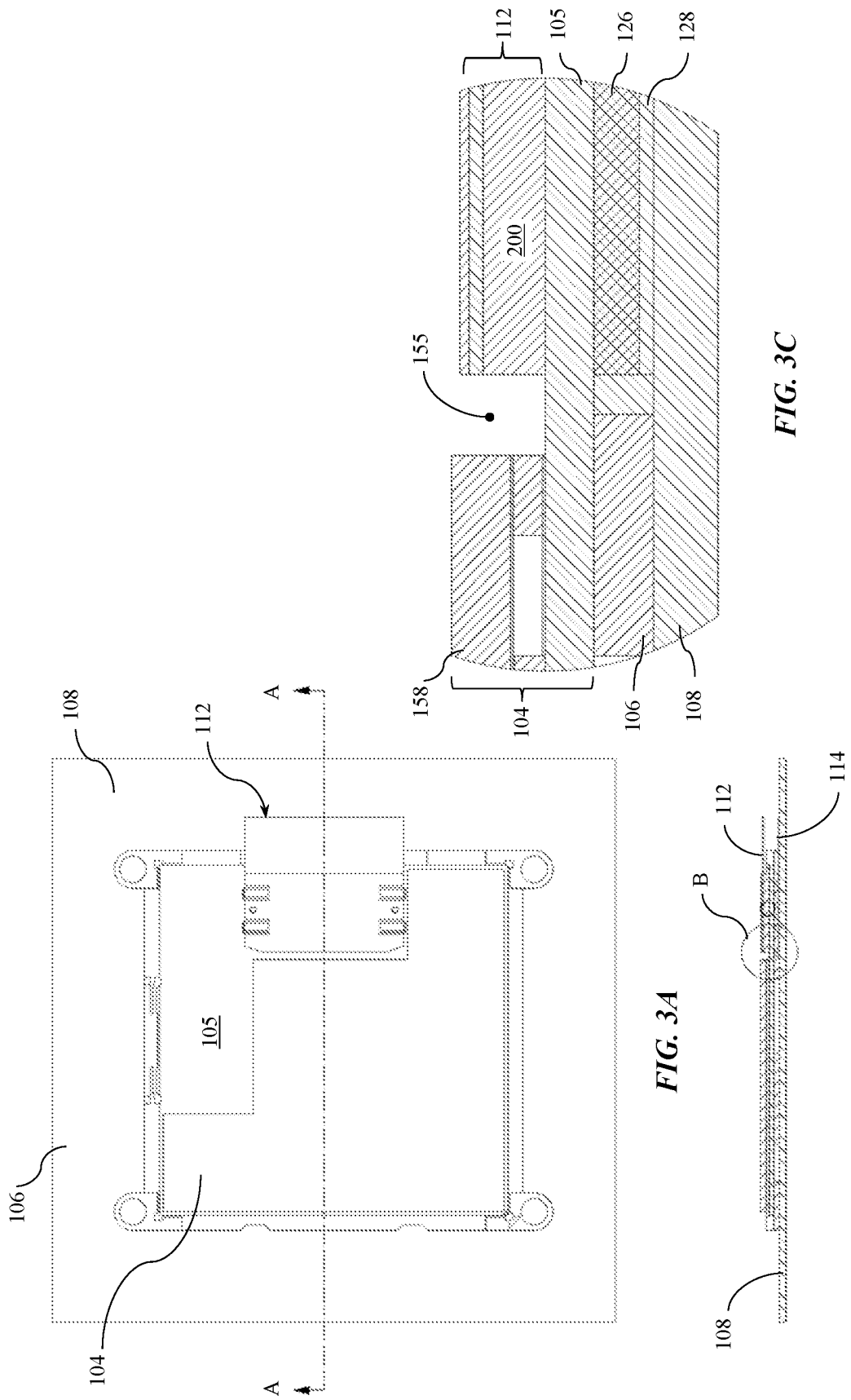
FIG. 3A illustrates a top plan view of the embodiment of FIG. 1.
FIG. 3B illustrates a cross-sectional view taken at line A-A in FIG. 3A.
FIG. 3C illustrates a highly enlarged view of a portion of the cross-section of FIG. 3B.

FIGS. 3A-3C illustrate several additional views of electronic structure 100. FIG. 3A illustrates a top plan view of a stack including package 104, socket 106, and MLB 108, including upper flex connector 112. FIG. 3B illustrates a cross-sectional view taken at line A-A of FIG. 3A, and FIG. 3C illustrates portion B from FIG. 3B. In the implementation of FIG. 3C, MLB 108 may be positioned at the bottom of a stack. Socket 106 overlies MLB 108 and is in electrical communication with the MLB. Lower flex connector portion 126, with its connected flexible portion 128, may be positioned in the cutout of the socket 106, as illustrated in FIGS. 1 and 2, with the top surface of the portion 126 being at the same height as top portions of the socket 106. Package substrate 105 of package 104 may overlie both socket 106 and portion 126 and make electrical connections therewith. Upper flex connector 112 may overlie package substrate 105 and make electrical connections therewith, at connector portion 200. Thus, within the same footprint of a package 104, multiple flex connectors may be vertically stacked, and may make electrical connections with different sides of the same package. Flex connector 112 may further be laterally separated from a compartment portion 158 of package 104, providing a gap 155, or may form an interference fit therewith. For example, compartment portion 158 may be a lid, or molding layer over one or more dies and/or components. For example, the compartment portion 158 may include one or more systems or sub-systems of the package 104.

Figure 4:
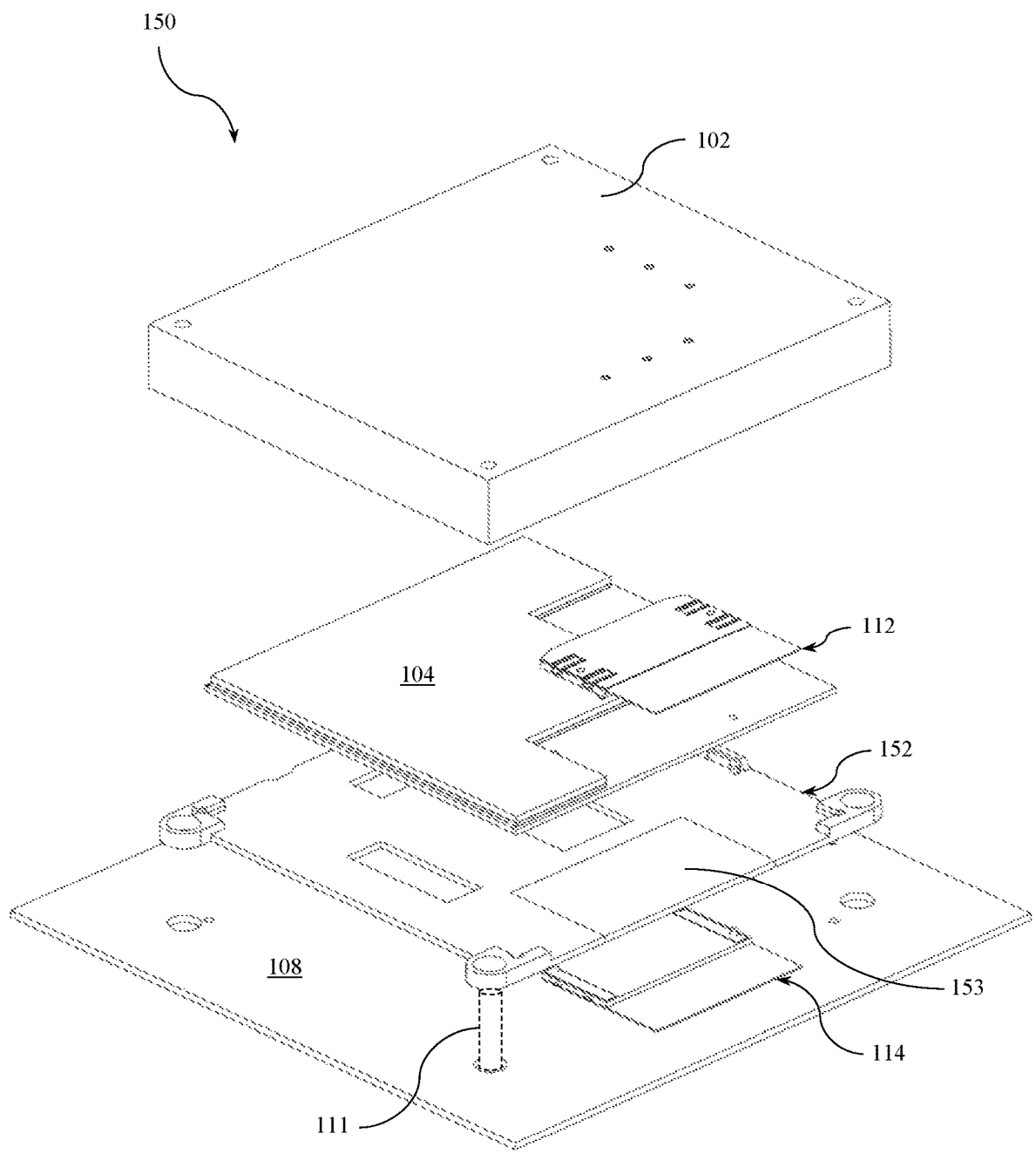
FIG. 4 illustrates an exploded perspective view of another embodiment of electronic components to be mounted to an MLB.

FIG. 4 illustrates a second exemplary embodiment of an electronic structure 150 including a socket having an integrated flex connector. FIG. 4 illustrates a heat sink 102, package 104, and MLB 108, with upper flex connector 112 and lower flex connector 114, which may be substantially similar to those described and illustrated with reference to FIGS. 1-3C. Electronic structure 150 may include a socket 152 which may be similar in some respects to socket 106, but includes a trench or cutout portion 153, demarcated by a line in the drawing, which is not entirely through a thickness of the socket and is thus different from cutout 116. Instead, cutout portion 153 forms a shelf on the bottom surface of the socket 152 in which the connector portion of flex connector 114 may be positioned. Cutout portion 153 may otherwise be substantially similar to cutout portion 116.

Figure 5:
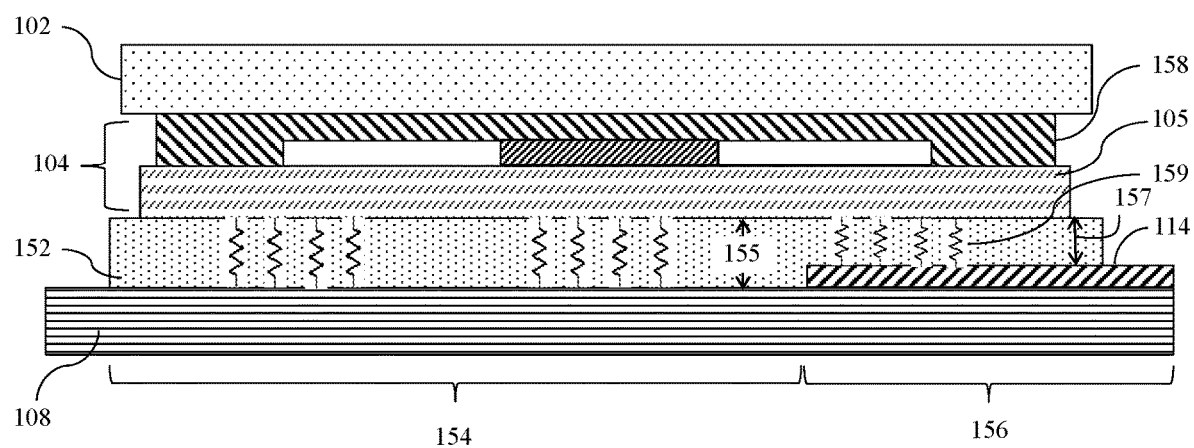
FIG. 5 illustrates a highly enlarged view of a portion of a cross-sectional view of the embodiment of FIG. 4, in a view similar to that of FIG. 3C.

FIG. 5 illustrates a cross-sectional view through an electronic structure 150, and shows heat sink 102, package 104, which may include compartment portion 158 and package substrate 105, socket 152, lower flex connector 114, and MLB 108, which may be stacked together and electrically interconnected as described elsewhere herein. In the intermediate embodiment of FIG. 5, upper flex connector 112 is optionally not included, or may be included but out of the plane of the cross-sectional view. Socket 152 may include a plurality of electrical conductors extending vertically therethrough, which may be socket spring pins 159, and which may provide electrical communication between package 104 and MLB 108. One or more of socket spring pins 159 may be located in cutout portion 153 and may provide electrical communication between package 104 and flex connector 114, a portion of which may be located in the shelf portion of the socket 152. Socket 152 thus defines at least two portions 154, 156. A first portion 154 has a first thickness 155 between upper and lower surfaces of socket 152, and may provide electrical communication between package 104 and MLB 108. A second portion 156, which corresponds to a linear portion of cutout 153, is thinner than portion 154, e.g., has a second thickness 157 that is less than the first thickness by an amount which may be equal to the vertical thickness of a connector portion of flex connector 114 that is captured between socket 152 and MLB 108. Socket spring pins 159 in the portion 156 may thus be shorter than the socket spring pins 159 in portion 154. Providing socket 152 with cutout portion 153 may permit use of standard flex connectors to make electrical connections through the socket with a package 104, without requiring adaptation of the package's external electrical connections to match those of the flex connector.

Figure 6A:
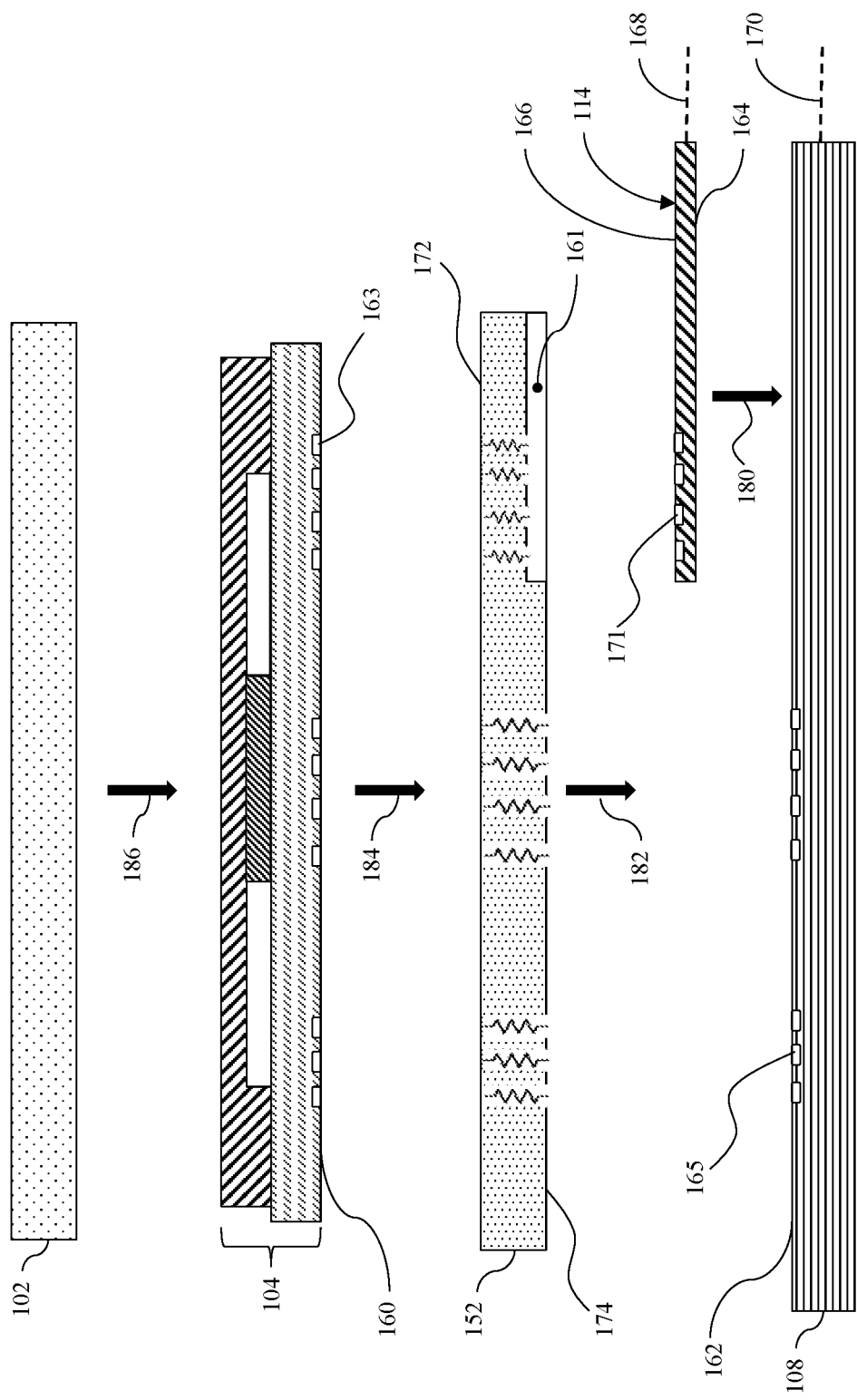
FIG. 6A illustrates an exemplary embodiment of a process of assembling electronic components.
Figure 6B:
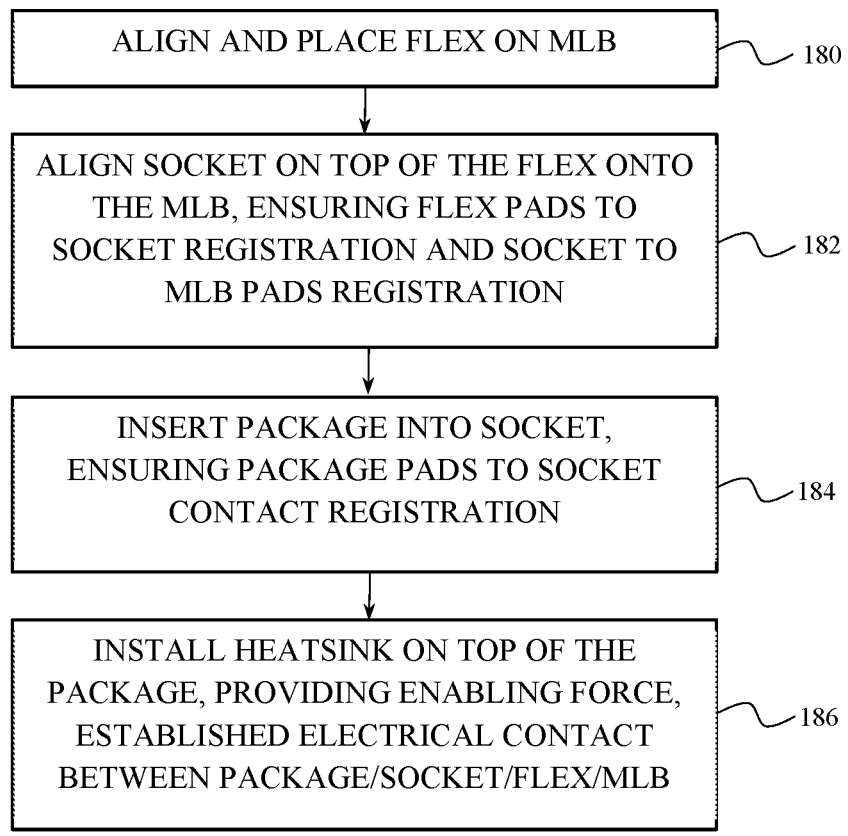
FIG. 6B illustrates a process flow chart for the process of FIG. 6A.

FIGS. 6A and 6B together illustrate and describe an embodiment of a process of assembling a stack of components. With reference first to FIG. 6A alone, the stack may include: an upper compression member, which may be a heat sink 102; package 104, including a lower surface 160 including electrical connectors 163; socket 152, which may include shelf 161 on a bottom portion as described elsewhere herein, and having an upper surface 172 and a bottom surface 174; lower flex connector 114, which may include a top surface 166 including electrical connectors 171, and a bottom surface 164; and MLB 108, which may include a top surface 162 having electrical connections 165 thereon.

With reference to both FIG. 6A and FIG. 6B, an example of an assembly method is illustrated. In a first operation 180, a flex connector is aligned and placed on an MLB. Thereafter, in operation 182, a socket is aligned on top of the flex connector onto the MLB, which may ensure that electrical connector pads of the flex are registered with pins of the socket for electrical communication therethrough, as well as ensuring registration of electrical connector pads or pins of the socket to those of the MLB. Thereafter in operation 184, a package is placed in the socket, which may ensure that electrical connector pads of the package are registered with pins in the socket. Thereafter, in operation 186, an upper compression member, which may be a heat sink, is positioned on top of the package and a compressive enabling force is applied down from and by the heat sink, which may establish electrical contact between the package, socket, flex connector, and MLB by compressing the stack of components together. A process as described with reference to FIGS. 6A and 6B may also be used to assemble any of the embodiments of FIGS. 1-3C, with the lower flex connector's connector portion extending completely through a cutout portion of an overlying socket and directly connecting to a package.

Figure 7B:
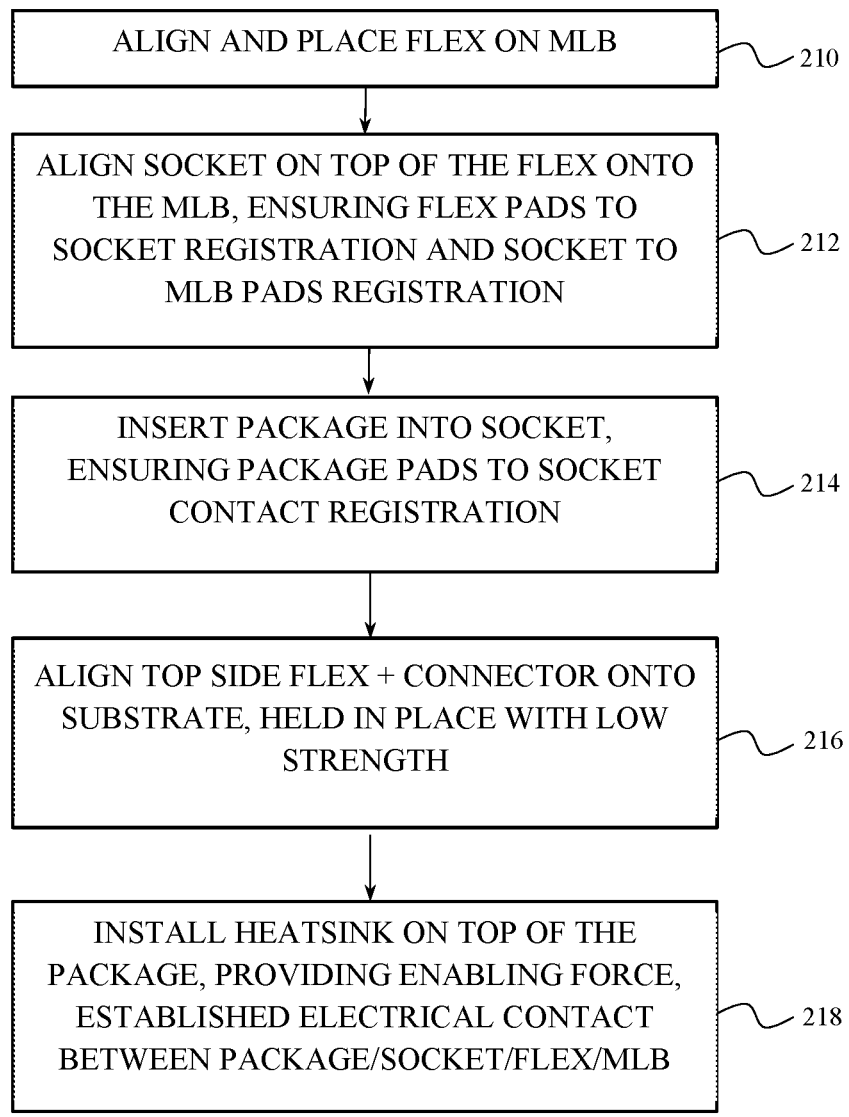
FIG. 7B illustrates a process flow chart for the process of FIG. 7A.

FIGS. 7A and 7B together illustrate and describe an embodiment of a process of assembling a stack of components. With reference first to FIG. 7A alone, the stack may include: an upper compression member, which may be a heat sink 102; package 104, including a lower surface 160 including electrical connectors 163; socket 152, which may include shelf or trench 161 on a bottom portion as described elsewhere herein, and which has an upper surface 172 and a lower surface 174; lower flex connector 114, which may include a top surface 169 including electrical connectors 171, and a bottom surface; and MLB 108, which may include a top surface 162 having electrical connections 165 thereon. Package 104 may include a substrate 105 which may include a ledge area 204 adjacent to the compartment to receive and electrically connect to a flex connector 112. Ledge area 204 may include a top surface 206 including electrical connectors 167.

With reference to both FIG. 7A and FIG. 7B, an example of an assembly method is illustrated. In a first operation 210, a flex connector is aligned and placed on an MLB. Thereafter, in operation 212, a socket is aligned on top of the flex connector onto the MLB, which may ensure that electrical connector pads of the flex connector are registered with pins of the socket for electrical communication therethrough, as well as ensuring registration of electrical connector pads or pins of the socket to those of the MLB. Thereafter, in operation 214, a package is placed in the socket, which may ensure that electrical connector pads of the package are registered with pins in the socket. Thereafter, in operation 216, an upper flex connector, which may include a connector portion 200 extending toward the package substrate 105, may be aligned and placed onto the upper surface of the package substrate, 206, in the ledge section 204 of the package substrate. The upper flex connector positioned in operation 216 may be held in place on the upper surface of the package substrate ledge, 206, by a low strength mechanism, which may include magnets, low strength adhesive, or the like, between the flex connector and the upper surface of the package substrate ledge 206. The combined height of the upper flex connector 112, including the connector portion 200, and of the package substrate 105 in ledge section 204 may be the same as the overall height of the package 104. Thereafter, in operation 218, an upper compression member, which may be a heat sink, is positioned on top of the package and the upper flex connector, and a compressive enabling force is applied down from and by the heat sink, which may establish electrical contact between the package, socket, flex connector, and MLB by compressing the stack of components together. A process as described with reference to FIGS. 7A and 7B may be used to assemble any of the embodiments of FIGS. 1-3C, with the lower flex connector's connector portion extending completely through an overlying socket and directly connecting to a package.

Dashed lines 168, 170 may indicate that flex connector 112 and/or 114, and MLB 108, may extend well beyond the portions illustrated in the drawing figure. Lines 168, 170 may also indicate that a second stack, which may be the same as or different from the stack illustrated in FIGS. 6A and 7A, is adjacent thereto and may be assembled at the same time, implementing operations which may be the same as those illustrated in and described with reference to FIGS. 6A and 6B, and FIGS. 7A and 7B. Thus, lines 168 and 170 may indicate that a process as described with reference to FIGS. 6A and 6B, or with reference to FIGS. 7A and 7B, may include forming two or more stacks simultaneously, with opposite ends of flex connector 112 and/or 114 interconnecting at least two of the stacks, and the stacks may be formed on the same MLB and electrically interconnected therethrough.

Figure 8:
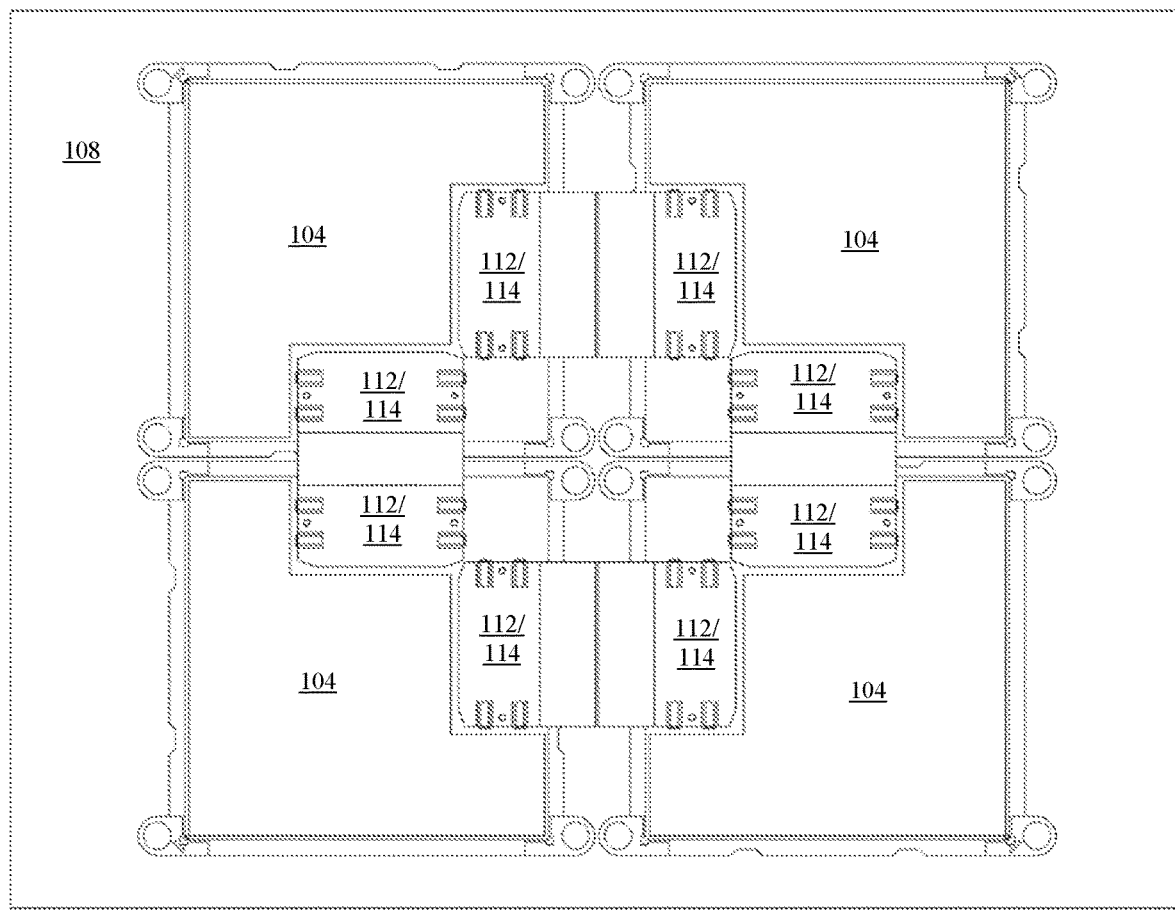
FIG. 8 illustrates a top plan view of an intermediate operation of assembling multiple sets of electronic subcomponents on a single MLB.

FIG. 8 illustrates a top plan view of a point of a process of interconnecting multiple stacks via flex connector 112 and/or flex connector 114. As discussed above, FIG. 8 illustrates that multiple stacks of components may be assembled on the same MLB 108, which assembly may be simultaneous, with flex connector 112 and/or flex connector 114 electrically connecting two or more of the stacks. Flex connector 112 and/or flex connector 114 may be an assembly of a flexible printed circuit (FPC) and a connector at the end of the FPC, which may be pre-assembled together. Thus, when flex connector 112 and/or flex connector 114 is connected between two or more stacks, e.g., two or four stacks as illustrated in FIG. 8, the term flex connector includes, but is not limited to, an FPC, optionally of a custom length, with connectors on either end of the FPC. FIG. 8 also illustrates that a package 104 may be configured to include multiple ledge portions (two being illustrated for each, but more than two may also be provided) located at different lateral sides of the package, and thus numerous combinations of upper flex connector(s) and lower flex connector(s) may be made for any one package.

Figure 9A:
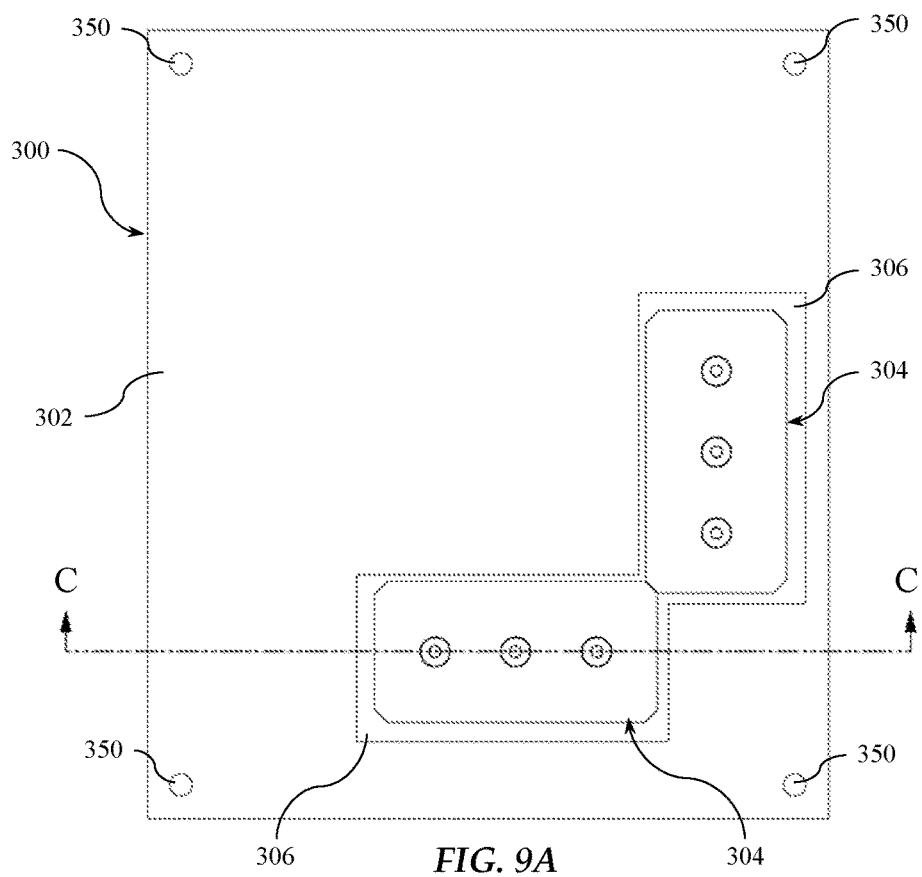
FIG. 9A illustrates a bottom plan view of an embodiment of a heat sink.

FIG. 9A illustrates an embodiment of a heat sink 300. Heat sink 300 may include a body 302 formed of one or more materials which act to transfer heat through the body, e.g., between upper and lower surfaces, e.g., copper. Body 302 may include one or more through holes 350 extending through the body from top to bottom, which may be located at any location in the body. Hole or holes 350 may align with the other alignment features described herein, e.g., fasteners 111, so that the heat sink 300 can be forced into contact with other components described elsewhere herein. In an embodiment, heat sink 300 is used and assembled with components in a manner similar to heat sink 102, and may hold one or more other components between the heat sink and an MLB, such as MLB 108.

Heat sink 300 may include one or more load controlling inserts 304 which may be positioned within corresponding cavities 306 formed in the body 302, and are formed of a material which can transmit forces as described herein, e.g., aluminum. Inserts 304 may be positioned so that, when body 302 is positioned over a stack of components, for example a stack such as that illustrated in FIG. 7A, with the inserts on the bottom of the body, the one or more inserts align over part or all of a flex connector, such as connector 112, and may more specifically be positioned over a top side of a connector portion 126 of a flex connector. As described in greater detail elsewhere herein, a load controlling insert 304 may apply an adjustable force to one or more components in the stack, e.g., a connector portion of a flex connector, which may assist in creating and maintaining electrical contact between the connector portion and an adjacent component in the stack.

Figure 9B:
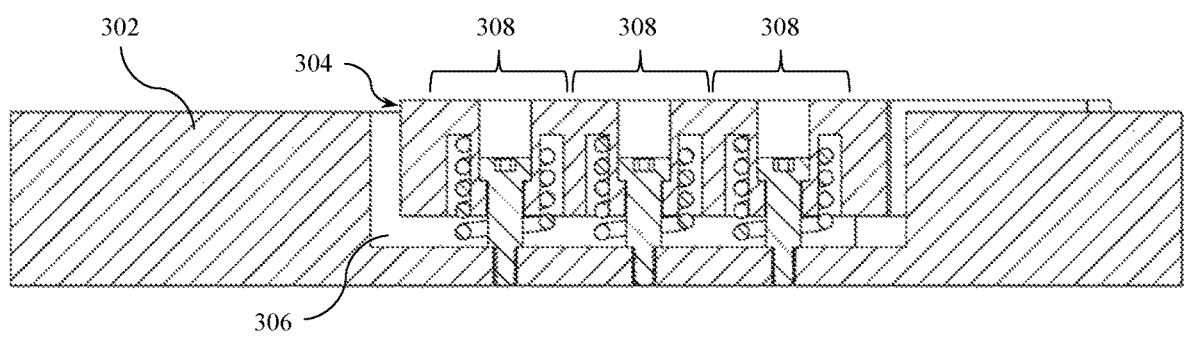
FIG. 9B illustrates a cross-sectional view taken at line C-C of the embodiment of FIG. 9A.
Figure 5:
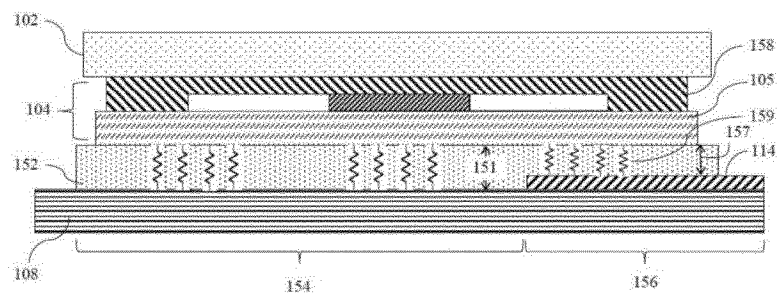

FIG. 9B illustrates a cross-sectional view taken at line C-C in FIG. 7A, and illustrates body 302 including a cavity 306 in which an exemplary load controlling insert 304 is mounted. Insert 304 may include one or more force control assemblies 308. Each force control assembly, of which three are illustrated only by way of a non-limiting example, is configured to transmit a variable force from the body 302 to a component underlying the assembly 308. The drawing figures show a linear arrangement of force control assemblies 308; however, other arrangements are also possible. Other embodiments can be arranged in a rectangle, triangle, circle, or any other geometric shape or pattern, to distribute compressive forces from the body 302 to an underlying component in the stack.

Each assembly 308 can be identical to other such assemblies 308 in a single body 302, or they can be different in size and/or force transmission. Assemblies 308 are illustrated as being generally rectangular, but may also be any other shape, e.g., circular or polygonal.

FIG. 9C illustrates a cross-sectional view similar to FIG. 3B, with heat sink 300 positioned at the top of a stack of components, which may be any of the components described elsewhere herein. Body 302 is held to MLB 108 using fasteners (not illustrated), which may be fasteners 111, with the other components between as described elsewhere herein. A connector portion 126 of a flex connector may be positioned directly adjacent and underneath load controlling insert 304, with the insert 304 exerting a load on the connector portion which may be dependent on one or more predetermined settings of the force control assemblies 308.

FIG. 10 illustrates a greatly enlarged cross-sectional view of a portion of load controlling insert 304, including a single force control assembly 308. A through bore 320 may be formed in body 302, which may be internally threaded. Assembly 308 may include a fastener 322 which connects and secures the assembly 308 to the body 302. Fastener 322 may be a screw, a rivet, a press-fit shaft, or any other fastener which can secure assembly 308 to body 302. In an embodiment illustrated in FIG. 10, fastener 322 is a screw, and includes external threads which mate with internal threads of bore 320, when provided. Fastener 322 may be circular in cross-section, e.g., when the fastener is a screw, but may also have any other cross-sectional shape.

Fastener 322 may include a first section 324 which fits into bore 320 and is secured therein. Fastener 322 may include a second section 326, which may be contiguous with first section 324, and may have an outer dimension, which may be an outer diameter, larger than an outer dimension or diameter of first section 324. When the outer dimension of the second section 326 is larger than the outer dimension of the first section 324, a shoulder 346 is formed between the two sections. Fastener 322 may also include a third section 328, which may be contiguous with second section 326, and may have an outer dimension, which may be an outer diameter, larger than an outer dimension or diameter of second section 326. When the outer dimension of the third section 328 is larger than the outer dimension of the second section 326, a shoulder 338 is formed between the two sections. Fastener 322 may optionally include a torque transmission element opening at the end of the fastener opposite first section 324, so that when the fastener must be rotated about its longitudinal axis, e.g., when it is a screw, a mating driver can transmit torque to the fastener.

Assembly 308 may include a variable force transmission member 330 interposed between the body 302 and the insert 304. In an illustrated embodiment of FIG. 10, member 330 may be a coil spring, but member 330 is not so limited and may be any of a disc spring or stack thereof, wave spring or stack thereof, polymer sleeve spring, or any other such device which functions to transmit a variable amount of force. The member 330 is captured between the body 302 and the insert 304 in a cavity 334 formed between an outer retaining wall 332, which may be cylindrical, and an inner post 336. Inner post 336 may be hollow and receive within it at least portions of fastener 322. Inner post 336 may include an inner shoulder 340 defined within cavity 342, the inner shoulder 340 defined at a point along the cavity at which the inner dimension, which may be a diameter, changes from a first, smaller dimension to a second, larger dimension. Inner shoulder 340 may act as a limit or stop against motion of the fastener 322, e.g., by engaging against shoulder 338. Cavity 342 includes an opening 344.

In operation, variable force transmission member 330 is positioned at least partially in cavity 334. Fastener 322 is then inserted through opening 344 into and through cavity 342, until first section 324 is at least partially in bore 320. Shoulder 338 and inner shoulder 340 engage each other, holding the insert 304 in place. If fastener 322 is a screw, the fastener is turned so that it threads into the internal threads of bore 320 a predetermined amount, which may be less than an amount when shoulder 346 engages body 302. In this manner, the amount of force transmitted by member 330 can be tailored to specific needs of the components of the stack, e.g., so that a connector portion of a flex connector, as illustrated in FIG. 9C, is not damaged but is still held in place and maintains its electrical connections. If the fastener 322 is a rivet or press-fit fastener, it is secured in a known manner to the body 302 without necessarily rotating the fastener in bore 320; however, the longitudinal length of the rivet or press-fit fastener also may determine an amount by which the member 330 is pre-loaded, if at all. In embodiments, the insert 304 floats relative to the body 302, because of the dual actions of the fastener 322 and the variable force generating member 330.

In utilizing the various aspects of the embodiments, it would become apparent to one skilled in the art that combinations or variations of the above embodiments are possible for integrating sockets and flex connectors. Although the embodiments have been described in language specific to structural features and/or methodological acts, it is to be understood that the appended claims are not necessarily limited to the specific features or acts described. The specific features and acts disclosed are instead to be understood as embodiments of the claims useful for illustration. The entirety of each of the aforementioned documents is incorporated by reference herein.

What is claimed is:

1. An electronic structure comprising:
a multi-layer board (MLB) having a top surface;
a flex connector including a set of flex electrical connectors, the flex connector being positioned on said MLB top surface with said set of flex electrical connectors oriented away from said MLB;
a socket having a top surface and a bottom surface, the socket including a plurality of socket electrical connectors extending therethrough between said top and bottom surfaces;
wherein the socket includes a first portion with a first thickness between said top and bottom surfaces, and a void completely through a thickness of a second portion, wherein the flex connector extends through said void;
wherein the socket is positioned with said first portion in contact with said MLB, and a portion of said flex connector including said set of flex electrical connectors positioned within the void in the socket; and
a package positioned directly on said socket on a side of said socket opposite said MLB, wherein said package comprises a ledge portion directly contacting and in electrical communication with said flex connector.

2. The electronic structure in accordance with claim 1, wherein said flex connector includes a flexible printed circuit (FPC) and a connector portion.

3. The electronic structure in accordance with claim 2, wherein the connector portion includes the set of flex electrical connectors.

4. The electronic structure in accordance with claim 1, wherein said flex connector is a first flex connector, and further comprising:
a second flex connector positioned vertically above said first flex connector and mounted to and in electrical communication with a surface of said package opposite said socket.

5. The electronic structure in accordance with claim 4, wherein said ledge portion comprises said surface of said package opposite said socket at which said package is in electrical communication with said second flex connector.

6. The electronic structure in accordance with claim 4, wherein:
the package has an overall vertical thickness and comprises a package substrate having a vertical thickness less than the package overall vertical thickness; and
a combined vertical thickness of the second flex connector and of the package substrate is the same as the overall vertical thickness of the package.

7. The electronic structure in accordance with claim 1, wherein said package is a first package and said set of flex electrical connectors is a first set of electrical connectors located at a first end of said flex connector, and further comprising:
a second package; and
a second set of flex electrical connectors located at a second end of said flex connector;
wherein said second set of flex electrical connectors is connected to said second package.

8. An electronic structure comprising:
a multi-layer board (MLB) having a top surface and a plurality of board electrical connections;
a flexible printed circuit (FPC) including a set of flex electrical connectors, the FPC being positioned on said MLB top surface with said set of flex electrical connectors oriented away from said MLB;
a socket having a top surface and a bottom surface, the socket including a plurality of socket electrical connectors extending therethrough between said top and bottom surfaces;
wherein the socket includes a first portion with a first thickness between said top and bottom surfaces, and a second portion with a second thickness between said top and bottom surfaces, wherein said first thickness is greater than said second thickness;
wherein the socket is positioned with said first portion in contact with said MLB, and a portion of said FPC including said set of flex electrical connectors is positioned between said second portion and said MLB;
wherein a vertical thickness of said socket in said first portion is the same as a combined vertical thickness of the socket and the FPC in the second portion; and
wherein said set of flex electrical connectors is vertically aligned with at least some of said plurality of socket electrical connectors.

9. The electronic structure in accordance with claim 8, further comprising:
a package positioned on and in electrical communication with said socket on a side of said socket opposite said MLB, said package directly contacting said socket in said second portion, and said socket directly contacting said flex connector in said second portion.

10. The electronic structure in accordance with claim 8, wherein the set of flex electrical connectors is a set of flex electrical connector pads, and the plurality of socket electrical connectors is a plurality of socket electrical connector pins.

11. The electronic structure in accordance with claim 9, wherein said FPC is a first FPC, and further comprising:
a second flex connector including a second FPC and a second connector portion positioned vertically above said first FPC and mounted to and in electrical communication with a surface of said package opposite said socket.

12. The electronic structure in accordance with claim 11, wherein said package comprises a ledge portion comprising said surface of said package opposite said socket at which said package is in electrical communication with said second flex connector.

13. The electronic structure in accordance with claim 9, wherein said package is a first package and said set of flex electrical connectors is a first set of electrical connectors located at a first end of said FPC, and further comprising:
a second package; and
a second set of flex electrical connectors located at a second end of said FPC;
wherein said second set of flex electrical connectors is connected to said second package.

14. The electronic structure in accordance with claim 11, wherein:
the package has an overall vertical thickness and comprises a package substrate having a vertical thickness less than the package overall vertical thickness; and
a combined vertical thickness of the second flex connector and of the package substrate is the same as the overall vertical thickness of the package.

15. An electronic structure comprising:
a multi-layer board (MLB) having a top surface;
a flex connector including a set of flex electrical connectors, the flex connector being positioned on said MLB top surface with said set of flex electrical connectors oriented away from said MLB;
a socket having a top surface and a bottom surface, the socket including a plurality of socket electrical connectors extending therethrough between said top and bottom surfaces;
wherein the socket includes a first portion with a first thickness between said top and bottom surfaces, and a second portion with a second thickness between said top and bottom surfaces, wherein said first thickness is greater than said second thickness;
wherein the socket is positioned with said first portion in contact with said MLB, and a portion of said flex connector including said set of flex electrical connectors positioned between said second portion and said MLB;
a heat sink positioned on a side of said socket opposite said MLB, the heat sink including
a heat conducting body including at least one cavity;
at least one load controlling insert positioned in said at least one cavity and attached to said body;
wherein said load controlling insert is configured and arranged to variably control load transmitted through said insert from said body;
wherein said at least one load controller insert is a force control assembly comprising:

a variable force generating member; and walls defining a cavity, said variable force generating member being captured in said cavity between said walls and said heat conducting body.

16. The heat sink in accordance with claim 15, wherein said variable force generating member comprises a coil spring, a disc spring, wave spring, or polymer sleeve spring.

\* \* \* \* \*

UNITED STATES PATENT AND TRADEMARK OFFICE
CERTIFICATE OF CORRECTION

PATENT NO. : 11,398,692 B2
APPLICATION NO. : 17/032488
DATED : July 26, 2022
INVENTOR(S) : Mahesh S. Hardikar et al.

It is certified that error appears in the above-identified patent and that said Letters Patent is hereby corrected as shown below:

In the Drawings

Please replace Fig. 5 with Fig. 5 as shown on the attached page.

In the Specification

Column 06,
Lines 25-26, Delete "first thickness 155" and insert in place there of --first thickness 151--.

In the Claims

Column 13,
Line 5, Claim 16, Delete "The heat sink" and insert in place there of --The electronic structure--.

Signed and Sealed this
Thirtieth Day of August, 2022

Katherine Kelly Vidal
*Director of the United States Patent and Trademark Office*